United States Patent
Kim (10) Patent No.: US 9,371,584 B2
(45) Date of Patent: Jun. 21, 2016

(54) PROCESSING CHAMBER AND METHOD FOR CENTERING A SUBSTRATE THEREIN

(75) Inventor: Kyung-Tae Kim, Suwon (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 488 days.

(21) Appl. No.: 13/044,474

(22) Filed: Mar. 9, 2011

(65) Prior Publication Data

US 2012/0227666 A1   Sep. 13, 2012

(51) Int. Cl.
*C23C 16/458* (2006.01)
*H01L 21/673* (2006.01)
(Continued)

(52) U.S. Cl.
CPC ............ *C23C 16/458* (2013.01); *C23C 16/4583* (2013.01); *C23C 16/4584* (2013.01);
(Continued)

(58) Field of Classification Search
CPC .............. C23C 16/458; C23C 16/4581; C23C 16/4582; C23C 16/4585–16/4586; C23C 21/673; C23C 21/67303; C23C 21/67309; C23C 21/6734; C23C 21/67346; C23C 21/67748; C23C 21/6835; C23C 16/4583; H01L 21/673; H01L 21/67303; H01L 21/67309; H01L 21/6734; H01L 21/67346; H01L 21/67748; H01L 2221/6835; H01L 2221/68304; H01L 2221/68309; H01L 2221/68368; H01L 21/67742; H01L 21/67745; H01L 21/67751; H01L 21/68; H01L 21/682; H01L 21/6835; H01L 21/68714–21/68792; H01L 51/56; B23Q 3/00–3/002; B23Q 3/18–3/186; B65G 49/06–49/062; B65G 49/063–49/066; C03B 2225/00–2225/02; C30B 35/00–35/007; G03F 7/70691–7/70791; Y10S 269/909; Y10S 414/135–414/136
USPC ............ 118/728, 729, 730, 715, 723 R, 500; 156/345.54; 414/222.04, 749.6
See application file for complete search history.

(56) References Cited

U.S. PATENT DOCUMENTS 5,352,294 A * 10/1994 White et al. ................. 118/725
5,471,279 A * 11/1995 Takizawa ....................... 355/73

(Continued)

FOREIGN PATENT DOCUMENTS

KR   2007007453 A  *  1/2007
KR   2008055176 A  *  6/2008
WO   WO 2008096717 A1 *  8/2008

OTHER PUBLICATIONS

English Translation of: KR 1020080055176 A, entitled "Glass Substrate Alignment Device of the Rubbing Stage, and Method Thereof," published Jun. 16, 2008, in the name of Insu Shin and assigned to LG Display Co., Ltd.*

*Primary Examiner* — Jeffrie R Lund
*Assistant Examiner* — Stanislav Antolin
(74) *Attorney, Agent, or Firm* — Patterson & Sheridan, LLP (57) ABSTRACT

A processing chamber and a method for centering a substrate therein is provided. In one embodiment, the processing chamber includes a chamber body, a support structure, lift pins, alignment pins and restriction assemblies. The support structure has an upper surface and is disposed in the chamber body. The lift pins, alignment pins and restriction assemblies are disposed on the upper surface. The lift pins are applied for bearing the substrate. Each of the alignment pins has a conical contact surface which can be extended from the upper surface to contact the edges of the substrate to provide lateral forces to center the substrate on the lift pins. Additionally, when the alignment pins and the lift pins are retracted, the substrate is lowered and placed between the restriction assemblies disposed on the upper surface to prevent the substrate from inadvertently moving laterally from the centered position.

8 Claims, 8 Drawing Sheets

(51) Int. Cl.
*H01L 21/68* (2006.01)
*H01L 21/687* (2006.01)

(52) U.S. Cl.
CPC ........ *H01L21/673* (2013.01); *H01L 21/67309* (2013.01); *H01L 21/68* (2013.01); *H01L 21/68721* (2013.01); *H01L 21/68728* (2013.01); *H01L 21/68742* (2013.01)

(56) References Cited

U.S. PATENT DOCUMENTS

| | | | |
|---|---|---|---|
| 5,589,224 A * | 12/1996 | Tepman | C23C 16/4585 118/715 |
| 5,803,977 A * | 9/1998 | Tepman | C23C 14/50 118/715 |
| 5,820,685 A * | 10/1998 | Kurihara | C23C 16/4583 118/715 |
| 6,036,784 A * | 3/2000 | Huang et al. | 118/728 |
| 6,146,463 A * | 11/2000 | Yudovsky et al. | 118/729 |
| 6,257,045 B1 * | 7/2001 | Hosokawa et al. | 73/1.79 |
| 6,298,685 B1 * | 10/2001 | Tepman | 62/378 |
| 6,437,296 B1 * | 8/2002 | Choi | 118/725 |
| 6,682,295 B2 * | 1/2004 | Blank et al. | 414/757 |
| 6,773,562 B1 * | 8/2004 | Inagawa et al. | 204/298.15 |
| 6,917,755 B2 * | 7/2005 | Nguyen et al. | 392/418 |
| D642,209 S * | 7/2011 | Kim | D15/138 |
| 2002/0079307 A1 * | 6/2002 | Choi | 118/725 |
| 2002/0170498 A1 * | 11/2002 | Paik | 118/728 |
| 2003/0072639 A1 * | 4/2003 | White et al. | 414/217 |
| 2003/0161706 A1 * | 8/2003 | Kurita et al. | 414/217 |
| 2003/0168175 A1 * | 9/2003 | Kim et al. | 156/345.51 |
| 2005/0284577 A1 * | 12/2005 | Kwon | 156/345.51 |
| 2006/0016398 A1 * | 1/2006 | Dubost | H01L 21/68742 118/728 |
| 2006/0102210 A1 * | 5/2006 | Chouno | H01L 21/67748 134/148 |
| 2006/0280871 A1 * | 12/2006 | Lindelauf et al. | 427/282 |
| 2007/0028842 A1 * | 2/2007 | Inagawa et al. | 118/728 |
| 2007/0029642 A1 * | 2/2007 | Inagawa et al. | 257/625 |
| 2007/0158583 A1 * | 7/2007 | Cho | H01L 21/67213 250/440.11 |
| 2008/0110397 A1 * | 5/2008 | Son | 118/500 |
| 2010/0264115 A1 * | 10/2010 | Kawamura et al. | 216/67 |

* cited by examiner

PROCESSING CHAMBER AND METHOD FOR CENTERING A SUBSTRATE THEREIN

BACKGROUND OF THE INVENTION

1. Field of the Invention

The present invention relates to a processing chamber and a method for centering a substrate therein.

2. Description of the Prior Art

In the manufacturing of integrated circuits, liquid crystal displays, flat panels and other electronic devices, multiple layers of materials are deposited onto and etched from substrates. The processing systems for manufacturing said devices typically include several vacuum processing chambers connected to a central transfer chamber to keep the substrate in a vacuum environment. Several sequential processing steps, such as physical vapor deposition (PVD), chemical vapor deposition (CVD), plasma enhanced CVD (PECVD), etching, and annealing, can be executed in said vacuum processing chambers respectively.

The substrates can be delivered from the transfer chamber to said processing chambers via transfer mechanisms (e.g. robot blade) and be placed on a support structure (e.g. susceptor or pedestal) of each processing chamber for processing. The transfer mechanisms can also transfer the substrate from one of the processing chambers to another. Moreover, the transfer mechanisms can slide underneath the back side of the substrate and then lift the substrate off the support structure without causing damage to either the support structure or the substrate. To facilitate the transportation of the substrate, a plurality of supporting members such as, for example, supporting pins, are disposed on the top surface of the support structure to lift the substrate apart from the top surface to create a space between the back side of the substrate and the top surface for the operation of the transfer mechanisms.

The processing of large glass substrates utilized for displays is in some ways similar to the processing of other types of substrates such as semiconductor wafers. Such glass substrates, however, are often larger than typical silicon wafers. For example, glass substrates may have a plane area greater than 600 mm×720 mm, to permit the formation of suitable displays. The utilization of large glass substrates introduces complexities into processing that may not be present when processing other types of substrates. For example, in addition to their size, glass substrates employed for displays are typically rectangular. The large size and shape of glass substrates can make them difficult to transfer from position to position within a processing system when compared with smaller, circular substrates. Consequently, systems for processing glass substrates generally require larger chambers, apertures, and transfer mechanisms. The need for larger chamber sizes to handle large substrates also leads to a requirement for larger and more powerful vacuum pumps, power supplies, control mechanisms and the like and a corresponding increase in system cost.

In addition, for proper set-up, calibration, and debugging of the automated movement of a substrate into and out of a processing chamber, and for proper deposition effect, alignment of the substrate to the susceptor is essentially required. A substrate aligning device was disclosed in U.S. Pat. No. 5,611,865, issued Feb. 14, 1996, by White et al. It is disclosed that by disposing a plurality of wedge shaped structures on the top flat surface of the supporting pin at the different corner of the susceptor, the substrate can be aligned to the center by the weight of the substrate itself.

However, as the supporting pins are only disposed on the corners of the susceptor, the size of the gap between the supporting pins increase with the size of the glass substrate, the stress inside the glass may be too large for the glass to bear due to the fracture of the substrate. When the size of the glass substrate is too large, the substrate sags under its own weight on the supporting pins. The sagging substrate causes gas to be trapped between the substrate and the susceptor surface as the substrate is lowered on the susceptor. The trapped gas may create a gas cushion that allows the substrate to move laterally over the susceptor, thus creating misalignment even if the substrate was previously aligned prior to being placed on the susceptor.

Therefore, a need exists for centering a substrate, especially a large substrate, in a processing chamber that prevents the above-mentioned problems.

SUMMARY OF THE INVENTION

In one aspect of the invention, a processing chamber for processing a substrate is provided.

In one embodiment, the processing chamber includes a chamber body, a support structure, a plurality of lift pins, a plurality of alignment pins and a plurality of restriction assemblies. The support structure is disposed in the chamber body, and the support structure has an upper surface. The lift pins are disposed on the upper surface to bear the substrate. The alignment pins are disposed on the upper surface, and each of the alignment pins has a conical contact surface. Particularly, the alignment pins can be extended from the upper surface to contact the edges of the substrate with the conical contact surfaces and provide lateral forces to center the substrate on the lift pins. The restriction assemblies are also disposed on the upper surface. When the alignment pins and the lift pins are retracted backwards to the upper surface, the substrate is lowered and placed between the restriction assemblies on the upper surface.

In another embodiment, the upper surface of the support structure has a first portion and a second portion surrounding the first portion. Moreover, said lift pins are disposed on the first portion, the alignment pins are disposed along the edge of the first portion, and the restriction assemblies are disposed on the second portion adjacent to the edge of the first portion.

Another aspect of the invention generally provides a method for centering a substrate in a processing chamber as described above.

In one embodiment, the method includes the steps of delivering the substrate on a plurality of lift pins on an upper surface of the support structure; extending a plurality of alignment pins from the upper surface, and each of the alignment pins having a conical contact surface to contact the edge of the substrate and provide a lateral force to center the substrate on the lift pins; and retracting the alignment pins and the lift pins, to place the substrate between a plurality of restriction assembly on the upper surface.

Additionally, the method can further include the step of extending the lift pins from the upper surface to receive the substrate before the delivery of the substrate.

In summary, the processing chamber of the invention includes alignment pins which can be extended from and retracted backwards to the upper surface of the support structure. Particularly, each of the alignment pins has a conical contact surface to contact the edge of the substrate and provide a lateral force to center the substrate on the lift pins. Accordingly, the alignment pins and related centering process can avoid damaging the substrate and the support structure because of the uncorrected position of the substrate.

The objective of the present invention will no doubt become obvious to those of ordinary skill in the art after reading the following detailed description of the preferred embodiment, which is illustrated in following figures and drawings.

BRIEF DESCRIPTION OF THE APPENDED DRAWINGS

The teachings of the present invention can be readily understood by considering the following detailed description in conjunction with the accompanying drawings, in which.

To facilitate understanding, identical reference numerals have been used, where possible to designate identical elements that are common to the figures.

DETAILED DESCRIPTION

Embodiments of the invention generally provides a processing chamber and a method for centering a substrate therein which has the advantage of increasing the yield rate by avoiding accidents that may occur because of the transfer process of lifting the substrate on or off the susceptor. The invention is illustratively described below in reference to a CVD system, for example, a PECVD system, available from AKT, a division of Applied Materials, Inc., Santa Clara, Calif. However, it should be understood that the invention has utility in other system configurations such as physical vapor deposition systems, ion implant systems, etch systems, chemical vapor deposition systems and any other systems in which lifting a substrate from a substrate support is desired.

For clarity and ease of description, an actuation sequence of one embodiment of the invention is described below with reference with FIG. 1 to FIG. 9.

Figure 1:
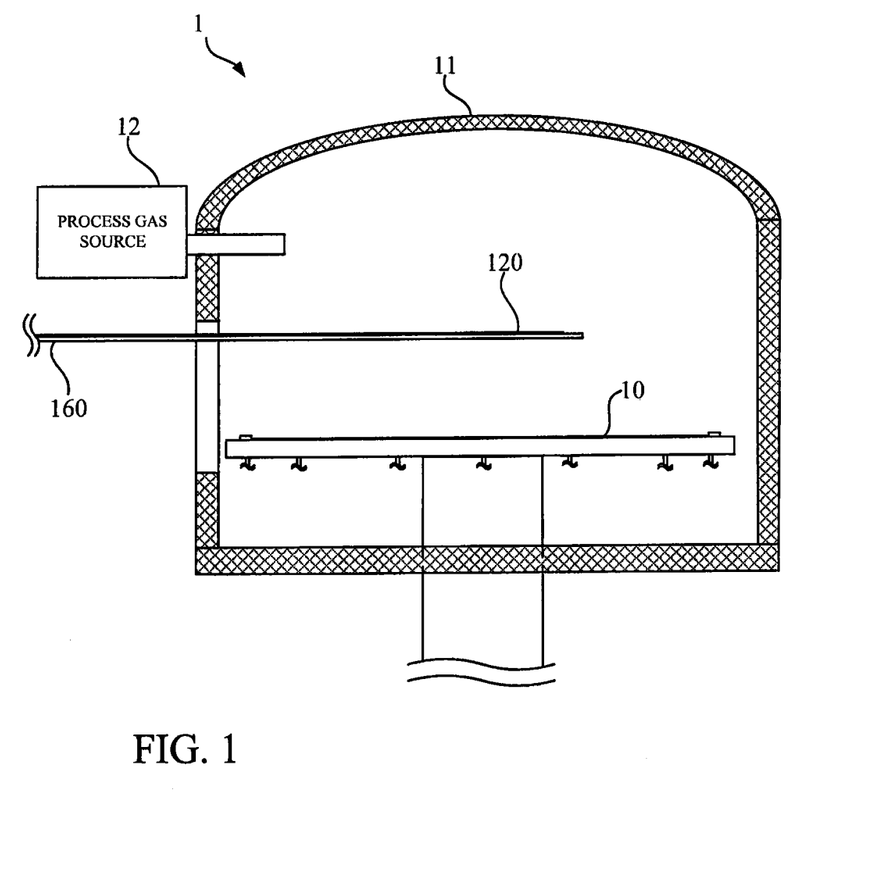
FIG. 1 is a schematic cross sectional view of one embodiment of a processing chamber described herein.

FIG. 1 is a schematic cross sectional view of one embodiment of a processing chamber described herein. The processing chamber 1, for example, a deposition chamber, includes a chamber body 11 with a process gas source 12 for providing the gases and vapors which are required during the processes. Generally, the chamber body 11 has walls, a bottom and a lid assembly that define a process volume. The process volume is typically accessed through a port in the walls that facilitates movement of a substrate 120 into and out of the chamber body 11. The walls and bottom are typically fabricated from a unitary block of aluminum.

As shown in FIG. 1, the processing chamber 1 further includes a support structure 10 for supporting the substrate 120 during the processes and a transfer mechanism 160 such as a robot blade for transferring the substrate from one chamber to another. The support structure 10 may include at least one embedded heating element (not shown). Moreover, the substrate 120 can be, but not limited to, a flat panel display, round wafer, liquid crystal display, glass panel substrate, plastic substrate, and the like.

Figure 2A:
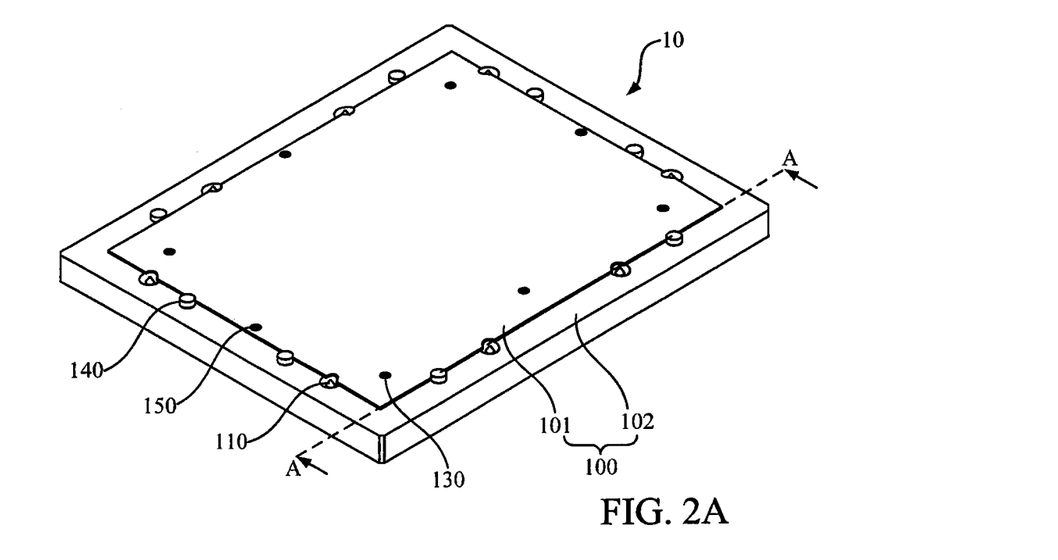
FIG. 2A is a schematic view of one embodiment of a support structure and components disposed thereon.
Figure 2B:
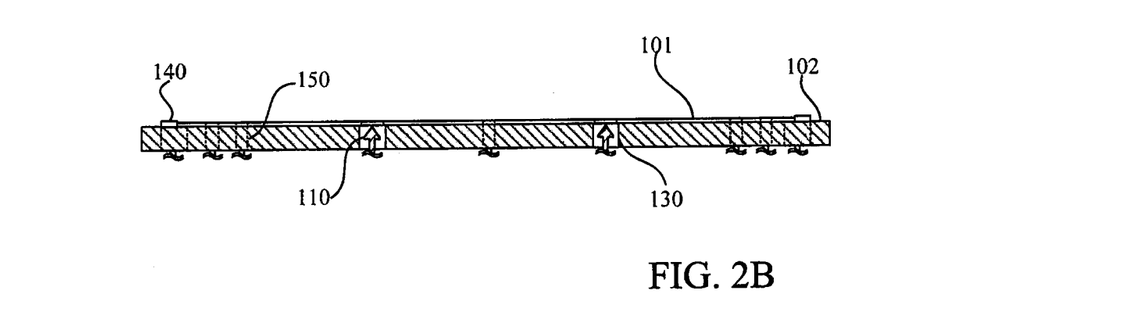
FIG. 2B is a cross sectional view along line A-A of FIG. 2A.

FIGS. 2A and 2B. FIG. 2A is a schematic view of one embodiment of a support structure 10 and components disposed thereon, and FIG. 2B is a cross sectional view along line A-A of FIG. 2A. Referring to both FIGS. 2A-2B, the support structure 10 is generally disposed in the chamber body 11 of the processing chamber 1. Moreover, a plurality of lift pins 150, alignment pins 110 and restriction assemblies 140 are disposed on the support structure 10. The alignment pins 110 and restriction assemblies 140 are arranged in two pairs of parallel rows, each row offset 90 degrees from the adjacent row. The rows of alignment pins 110 each include at least two alignment pins 110 disposed on opposite sides of the second center line 126.

The support structure 10 supports the substrate 120 during processing within the chamber, for example, during the above-mentioned CVD, PECVD, PVD, etching, annealing and other suitable processes. The support structure 10 may also be suitable for application in any testing chamber, processing chamber, or system that requires support of a substrate 120. For example, the support structure 10 is particularly useful for a deposition chamber, such as a CVD chamber or a PECVD chamber, where accurate positioning of the substrate is desirable. Furthermore, the substrate 120 can be a semiconductor substrate for electronic devices, a glass substrate for flat panels or liquid crystal displays, a plastic substrate, and the like.

The support structure 10 has an upper surface 100 on which the substrate 120 is placed. The upper surface 100 comprises a first portion 101 and a second portion 102 surrounding the first portion 101. In an embodiment, the level of the first portion 101 is higher than that of the second portion 102. The substrate 120 is disposed on the first portion 101 of the support structure 10 during processing. The support structure 10 generally is fabricated of aluminum, ceramic or any other material having a low thermal expansion coefficient or a combination of listed materials.

Furthermore, a plurality of cavities 130 are formed on the support structure 10 to accept a plurality of lift pins 150 and alignment pins 110, wherein the cavities 130 refer to through holes. The lift pins 150 are positioned radially inwards the alignment pins 110 on the upper surface 100 of the support structure 10. Each of the lift pins 150 has a ball element is disposed in a cavity formed in the top end of the lift pin 150 for bearing the substrate. A more detailed description of such a ball type lift pins 150 may be found in U.S. patent application Ser. No. 09/982,406, titled as "SUBSTRATE SUPPORT", assigned to Applied Materials, Inc., which is incorporated herein by reference.

Figure 3A:
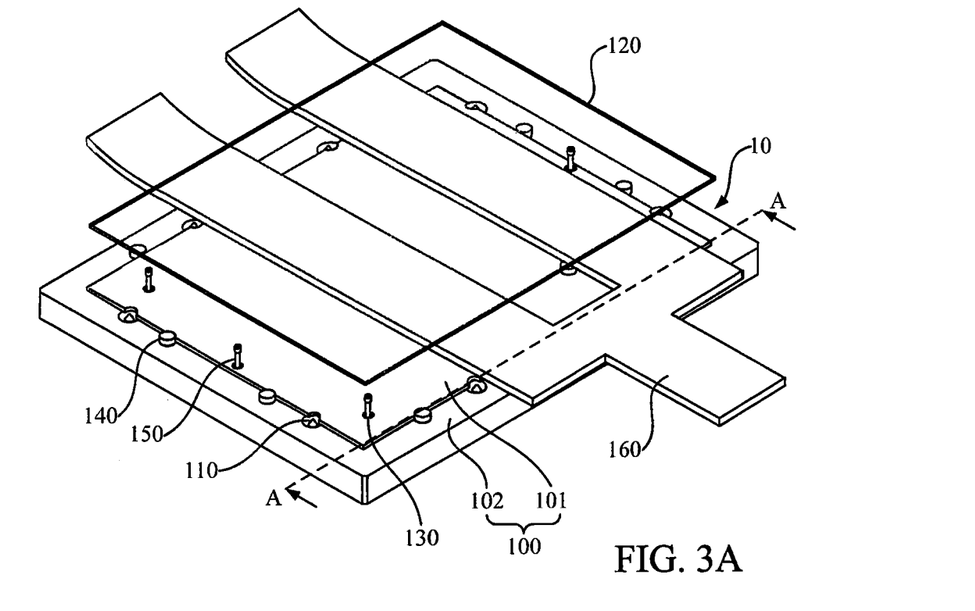
FIG. 3A is a schematic view of one embodiment of a support structure and components disposed thereon.
Figure 3B:
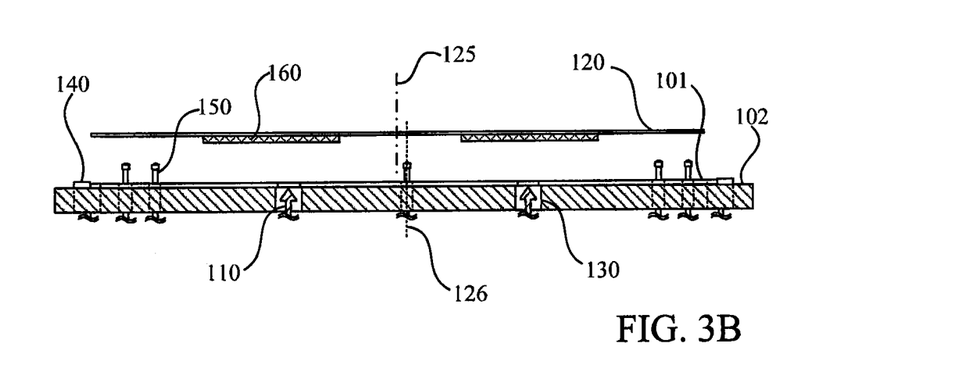
FIG. 3B is a cross sectional view along line A-A of FIG. 3A.

FIG. 3A is a schematic view of one embodiment of a support structure and components disposed thereon. FIG. 3B is a cross sectional view along line A-A of FIG. 3A. Referring now to FIGS. 3A-3B, to facilitate the transportation of the substrate 120, the lift pins 150 are disposed on the upper surface 100 of the support structure 10, when the transfer progress begins, the lift pins 150 are extended from the cavities 130 to create a supporting surface to bear the substrate 120 in a position spaced apart from the upper surface 100 to create the space between the substrate 120 and the upper surface 100 of the support structure 10 to accommodate the transfer mechanism 160.

Particularly, a first center line 125 and a second center line 126 are defined as the center line of the substrate 120 and the support structure 10 respectively. As shown in FIG. 3B, the substrate 120 is not yet centered since the first center line 125 is clearly apart (i.e., offset) from the second center line 126.

Figure 4A:
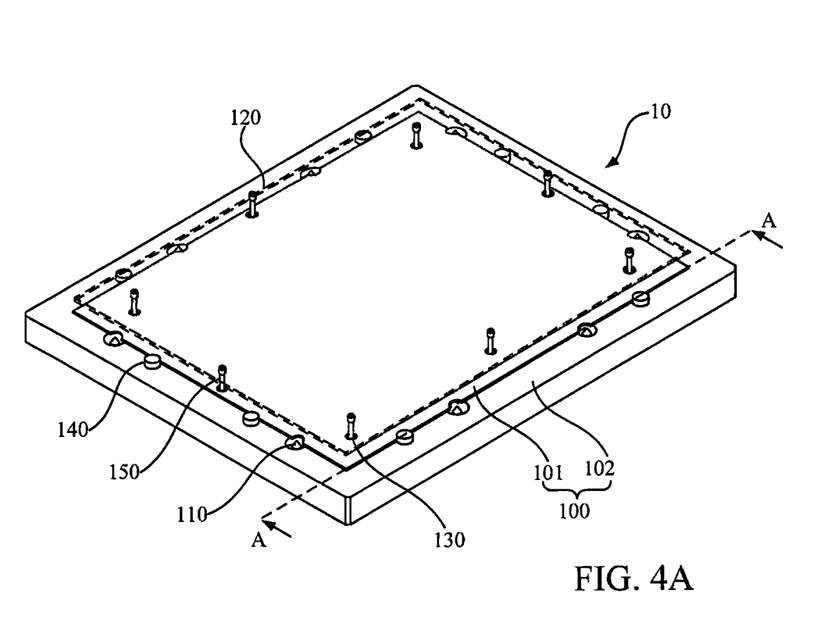
FIG. 4A is a schematic view of one embodiment of a support structure and components disposed thereon.
Figure 4B:
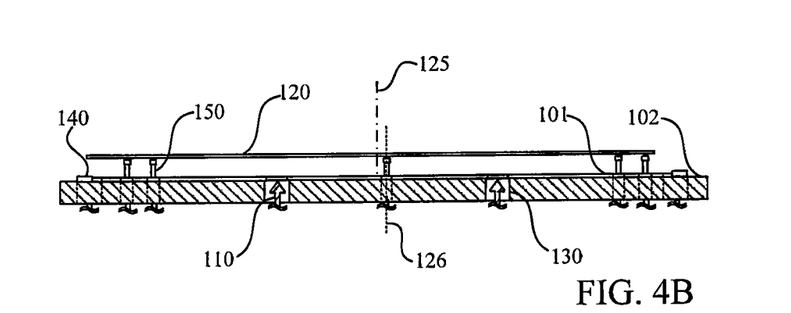
FIG. 4B is a cross sectional view along line A-A of FIG. 4A.

Referring now to FIGS. 4A-4B, as the lift pins 150 are extended to a certain height, the transfer mechanism 160 descends toward the upper surface 100 and leaves the substrate 120 on the top ends of the extended lift pins 150. Once the substrate 120 is supported on the lift pins 150, the transfer mechanism 160 retracts horizontally from the space between the substrate 120 and the upper surface 100 of the support structure 10.

Figure 5A:
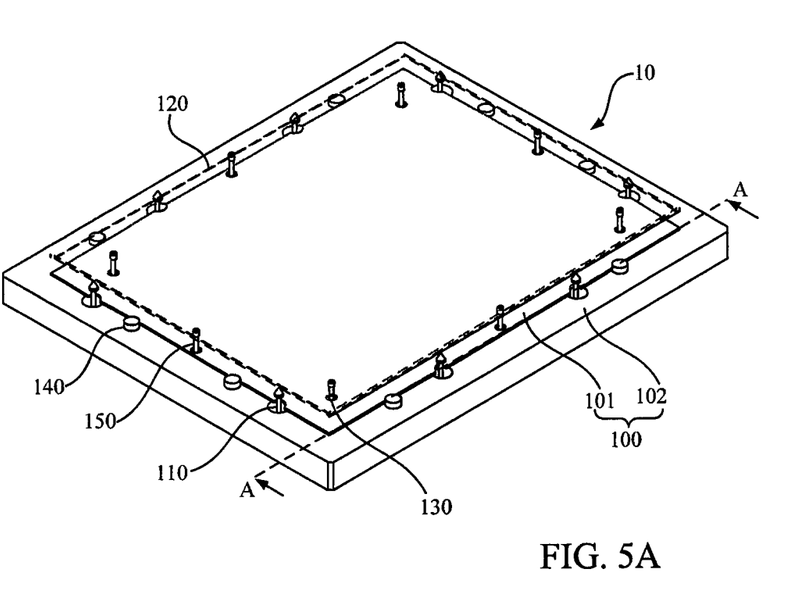
FIG. 5A is a schematic view of one embodiment of a support structure and components disposed thereon.
Figure 5B:
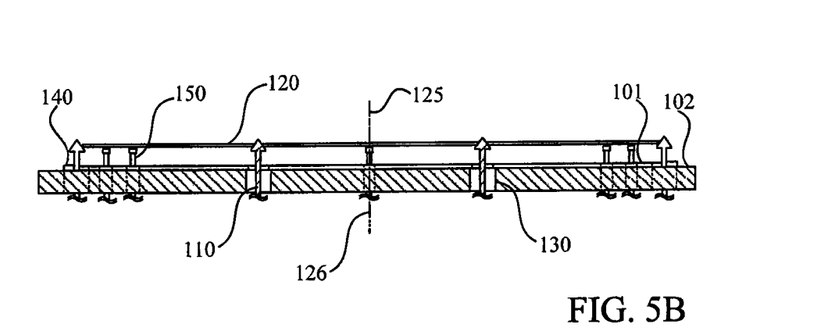
FIG. 5B is a cross sectional view along line A-A of FIG. 5A.

Referring now to FIG. 5A and FIG. 5B, with the transfer mechanism 160 removed from the space between the substrate 120 and the upper surface 100 of the support structure 10, the alignment pins 110 are actuated and extended vertically from the cavities 130 along the four edges of the first portion 101 to apply a lateral force to the four edges of the substrate 120. Since the substrate 120 is supported on the ball elements of the lift pins 150, the substrate 120 may move laterally over the support structure 10 without scratching the bottom of the substrate. Furthermore, the conical top surface of the alignment pins 110 only have point contact with the substrate 120 at the edge of the bottom surface 122 of the substrate 120 so that the alignment pins 110 apply a lateral force to the substrate 120 to center the substrate 120 as the alignment pin 110 is vertically extended.

As mentioned above, the first center line 125 and the second center line 126 are defined as the center line of the substrate 120 and the support structure 10 respectively. As shown in FIG. 5B, the substrate 120 is centered by the alignment pin 110 as the first center line 125 becomes co-linear with the second center line 126.

Figure 6A:
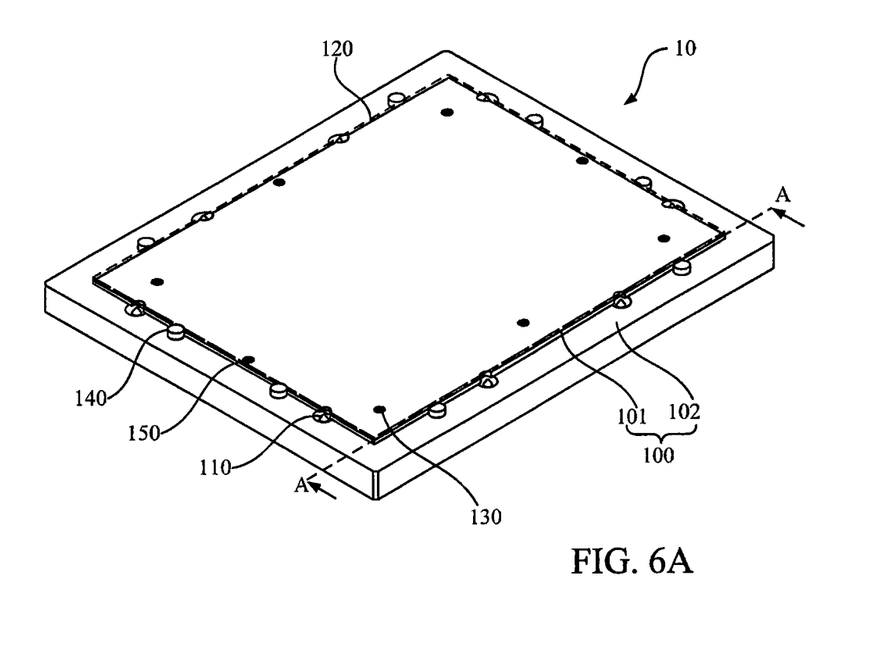
FIG. 6A is a schematic view of one embodiment of a support structure and components disposed thereon.
Figure 6B:
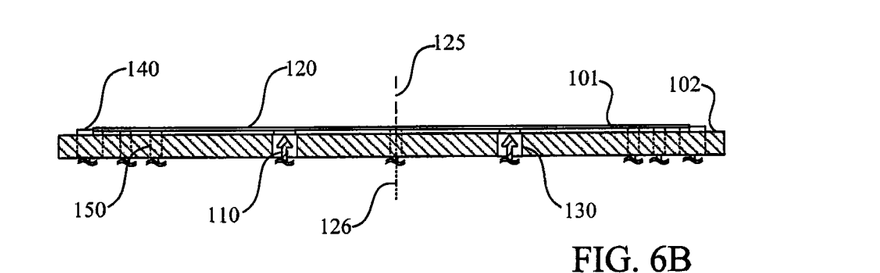
FIG. 6B is a cross sectional view along line A-A of FIG. 6A.

Referring to FIG. 6A and FIG. 6B, once the substrate 120 is centered, the alignment pins 110 are retracted back into the cavities 130 along the edge of the first portion 101. Sequentially, the lift pins 150 are retracted back into the cavities 130 on the first portion 101 to lower the substrate 120 onto the first portion 101 precisely between the restriction assemblies 140 disposed on the second portion 102 along the edge of the first portion 101. The restriction assemblies 140 prevent the substrate 120 from moving laterally once in contact with the first portion 101 in the event that gases temporarily create a cushion of gas on which the substrate may slide.

The restriction assemblies 140 may comprise a plurality of rollers disposed on the second portion 102 of the upper surface 100 along the edge of the first portion 101. The rollers have an axis of rotation perpendicular to the first portion 101.

Figure 7:
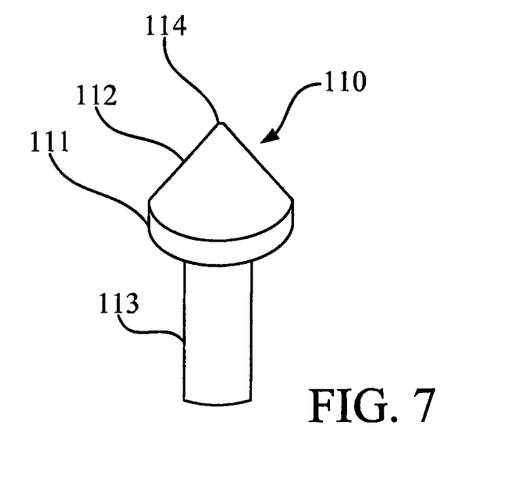
FIG. 7 is a perspective view of one embodiment of an alignment pin described herein.

FIG. 7 is a perspective view of one embodiment of the alignment pin 110 described herein. The alignment pin comprises a head portion 111, a column portion 113 and a tip 114. The head portion 111 comprise a conical contact surface 112, wherein the conical contact surface 112 refers to a continuous smooth awl shaped surface for making a point contact with a point on the edge of the substrate 120 and provide a lateral force to center the substrate 120 on the lift pins 150. During the centering process, the tip 114 does not contact the substrate 120. Furthermore, the conical contact surface 112 is not limited to a circular cone, more derivative designs of the alignment pin 110 are shown in FIG. 8A to 8D.

Figure 8A:
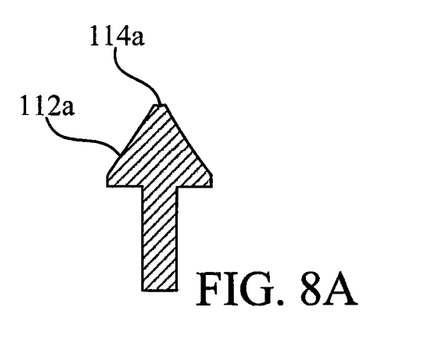
FIG. 8A to 8D each shows a derivative design of an alignment pin described herein.
Figure 8B:
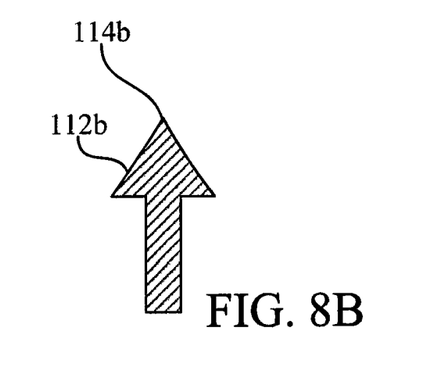
Figure 8C:
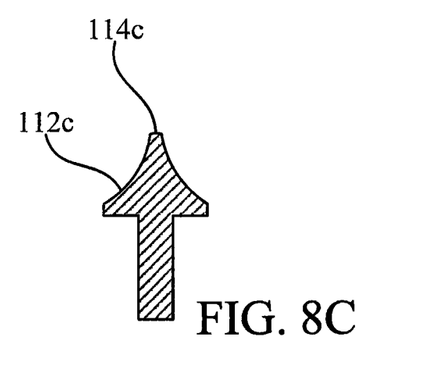
Figure 8D:
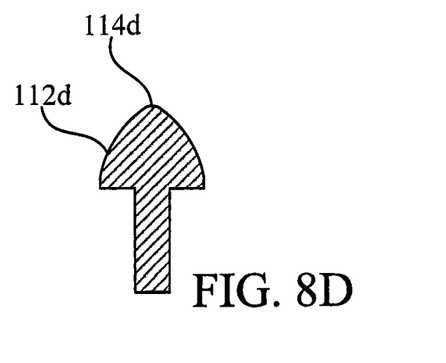

FIG. 8A to 8D each illustrates a derivative design of an alignment pin. The major feature of the derivative designs are the shape of the conical contact surface 112. As shown in FIG. 8A, the head portion of the alignment pin 110 comprises a standard circular cone 112a with a flat tip 114a. As shown in FIG. 8B, the head portion of the alignment pin 110 comprises a standard circular cone 112b with a pointed tip 114b. As shown in FIG. 8C, the head portion of the alignment pin 110 comprises a concave shaped contact surface 112c with a flat tip 114c. In addition, as shown in FIG. 8D, the head portion of the alignment pin 110 comprises a convex shaped contact surface 112d with a flat tip 114d. The plurality of designs which have different shapes and slopes can be applied on different situations in according to the size and the acceleration the substrate 120 can bear without damage. Certainly, the alignment pin can be designed to have other types of contact surface to properly center different substrates.

The method of the invention can be applied for centering a substrate in the above-mentioned processing chamber or other suitable processing chambers. Please refer to FIG. 9 with reference to FIG. 2A to 6B for the detail illustration of the method of the invention.

Figure 9:
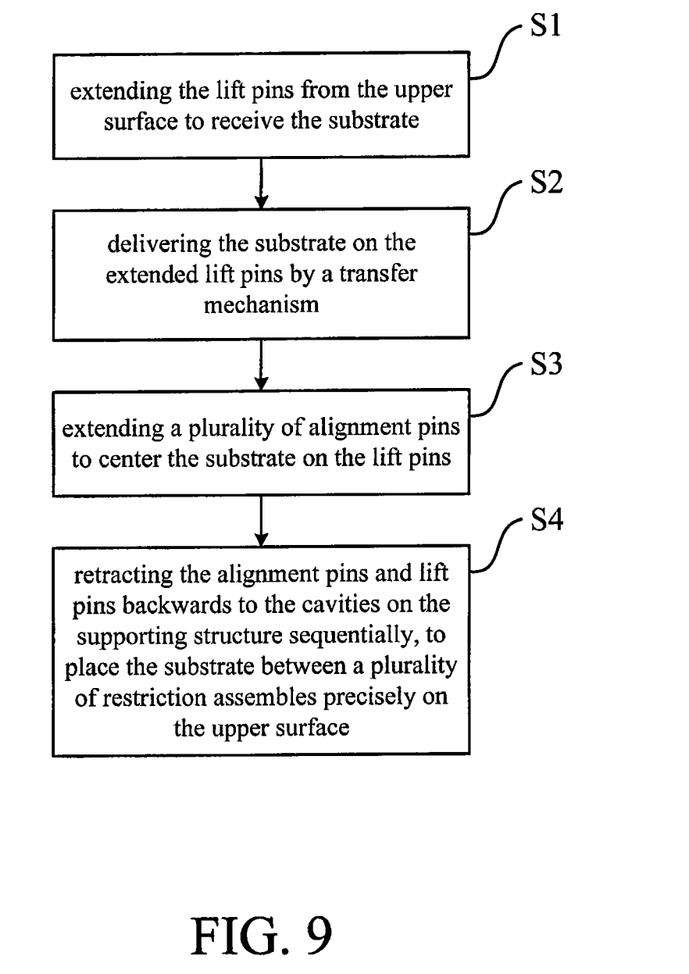
FIG. 9 is a flow diagram depicting an aligning process of an embodiment of the invention.

FIG. 9 is a flow diagram depicting an aligning process of an embodiment of the invention. The process includes the following steps of:

Firstly, extending the lift pins 150 from the upper surface 100 to receive the substrate 120 (S1). Then, delivering the substrate 120 on the extended lift pins 150 on an upper surface 100 of the support structure 10 by a transfer mechanism 160 such as a robot blade (S2). As mentioned above, the substrate 120 can be, but not limited to, a flat panel display, round wafer, liquid crystal display, glass panel substrate, plastic substrate, and the like.

Then extending a plurality of alignment pins 110 from the upper surface 100, and each of the alignment pins 110 having a conical contact surface 112 to contact the edge of the substrate 120 and provide a lateral force to center the substrate 120 on the lift pins 150 (S3). The lift pins 150 may include rollers or ball elements to allow the substrate 120 to roll across the top ends of the lift pins 150 without scratching. The alignment pins 110 then lift pins 150 are sequentially retracted into the cavities 130 on the support structure 10 to place the substrate 120 precisely on the upper surface 100 (S4) between a plurality of restriction assemblies 140.

In summary, the processing chamber of the invention includes alignment pins which can be extended from and retracted backwards to the upper surface of the support structure to impart a lateral centering force on a substrate. Particularly, each of the alignment pins has a conical contact surface to contact the edge of the substrate and provide a lateral force to center the substrate on the lift pins. Accordingly, the alignment pins and related centering process prevents substrate damage and/or poor processing results due to misalignment.

With the example and explanations above, the features and spirits of the embodiments of the invention are described. Those skilled in the art will readily observe that numerous modifications and alterations of the device may be made while retaining the teaching of the invention. Accordingly, the above disclosure should be construed as limited only by the metes and bounds of the appended claims.

What is claimed is:
1. A processing chamber comprising:
a chamber body;
a support structure disposed in the chamber body, the support structure having an upper surface configured to support a substrate thereon;

a plurality of lift pins extendable through the upper surface for spacing the substrate above the upper surface and retractable to set the substrate on the upper surface;

a plurality of alignment pins disposed through the support structure, each of the alignment pins having a conical contact surface, the alignment pins arranged in two pairs of parallel rows, each row having an orientation 90 degrees offset from the adjacent row, the conical contact surface movable between a retracted position below the upper surface of the support structure and an extended position above the upper surface of the support structure, wherein the conical contact surface disposed above the upper surface of the support structure when in the extended position contacts an edge of the substrate to provide a lateral force on an edge of the substrate to center the substrate on the upper surface of the support structure; and a plurality of restriction assemblies, arranged in a rectangular pattern, coupled to and projecting above the upper surface in a position to retain the substrate between the plurality of restriction assemblies after centering by, and retraction of, the alignment pins.

2. The processing chamber of claim 1, wherein the upper surface has a first portion and a second portion surrounding the first portion, the plurality of lift pins are disposed on the first portion, the alignment pins are disposed along an edge of the first portion, and the restriction assemblies are disposed on the second portion adjacent to an edge of the first portion.

3. The processing chamber of claim 2, wherein the first portion extends above the second portion.

4. The processing chamber of claim 1, wherein each of the lift pins has a ball element disposed in a cavity formed in a top end of the lift pin for bearing the substrate.

5. The processing chamber of claim 1, wherein the lift pins are disposed inward of the alignment pins.

6. The processing chamber of claim 1, wherein each row of alignment pins comprises at least two alignment pins disposed on opposite sides of a center line of the support structure.

7. The processing chamber of claim 1, wherein the processing chamber is a PECVD chamber.

8. The processing chamber of claim 1, wherein the lift pins are independently movable relative to the alignment pins.

* * * * *